United States Patent
Bouchoucha et al.

(10) Patent No.: US 8,726,736 B2
(45) Date of Patent: May 20, 2014

(54) METHOD FOR DETERMINING THE LOCAL STRESS INDUCED IN A SEMICONDUCTOR MATERIAL WAFER BY THROUGH VIAS

(75) Inventors: Mohamed Bouchoucha, Grenoble (FR); Pascal Chausse, Fontaine (FR); Laurent-Luc Chapelon, Domene (FR)

(73) Assignees: STMicroelectronics (Crolles 2) SAS, Crolles (FR); Commissariat à l'Énergie Atomique et aux Énergies Alternatives, Paris (FR)

( * ) Notice: Subject to any disclaimer, the term of this patent is extended or adjusted under 35 U.S.C. 154(b) by 42 days.

(21) Appl. No.: 13/524,699

(22) Filed: Jun. 15, 2012

(65) Prior Publication Data

US 2013/0112974 A1    May 9, 2013

(30) Foreign Application Priority Data

Jun. 30, 2011    (FR) ...................... 11 55877

(51) Int. Cl.
*G01B 5/00*    (2006.01)

(52) U.S. Cl.
USPC .......................................................... 73/777

(58) Field of Classification Search
USPC ................... 73/760, 777, 862.381, 862.391
See application file for complete search history.

(56) References Cited

U.S. PATENT DOCUMENTS

| | | | |
|---|---|---|---|
| 6,678,055 B2 * | 1/2004 | Du-Nour et al. | 356/504 |
| 6,902,316 B1 * | 6/2005 | Pierce et al. | 374/7 |
| 8,501,075 B2 * | 8/2013 | Philippi et al. | 264/401 |
| 2002/0190252 A1 * | 12/2002 | Adams et al. | 257/48 |
| 2003/0098704 A1 * | 5/2003 | Du-Nour et al. | 324/765 |
| 2008/0308800 A1 * | 12/2008 | Otsuki | 257/48 |
| 2009/0206488 A1 | 8/2009 | Lindgren et al. | |
| 2010/0072620 A1 | 3/2010 | Wang et al. | |
| 2011/0101531 A1 * | 5/2011 | Neuilly et al. | 257/751 |

OTHER PUBLICATIONS

French Search Report and Written Opinion datd Jan. 11, 2012 from corresponding French Application No. 11/55877.
Gyujei Lee et al: *Quantification of Micropartial Residual Stress for Mechanical Characterization of TSV Through Nanoinstrumented Indentation Test*, Electronic Components and Technology Conference (ECTC), 2010 Proceedings 60th, IEEE, Piscataway, NJ, USA, Jun. 1, 2010, pp. 200-205, XP031694125.
Masahiro Sunohara et al: *Studies on Electrical performance and thermal stress of a silicon interposer with TSVs*, Electronic Components and Technology Conference (ECTC), 2010 Proceedings 60th, IEEE, Piscataway, NJ, USA, Jun. 1, 2010, pp. 1088-1093, XP031694068.
A. Mercha et al: *Comprehensive Analysis of the Impact of Single and Arrays of Through Silicon Vias Induced Stress on High-K / Metal Gate CMOS performance*, 2010 International Electron Devices Meeting, Dec. 1, 2010, pp. 2.2.1-2.2.4, XP55016193.

* cited by examiner

*Primary Examiner* — Max Noori
(74) *Attorney, Agent, or Firm* — Wolf, Greenfield & Sacks, P.C.

(57) ABSTRACT

A method for determining, in a first semiconductor material wafer having at least one through via, mechanical stress induced by the at least one through via, this method including the steps of: manufacturing a test structure from a second wafer of the same nature as the first wafer, in which the at least one through via is formed by a substantially identical method, a rear surface layer being further arranged on this second wafer so that the via emerges on the layer; measuring the mechanical stress in the rear surface layer; and deducing therefrom the mechanical stress induced in the first semiconductor material wafer.

10 Claims, 2 Drawing Sheets

METHOD FOR DETERMINING THE LOCAL STRESS INDUCED IN A SEMICONDUCTOR MATERIAL WAFER BY THROUGH VIAS

CROSS REFERENCE TO RELATED APPLICATIONS

This application claims the priority benefit of French patent application number 11/55877, filed on Jun. 30, 2011, entitled METHOD FOR DETERMINING THE LOCAL STRESS INDUCED IN A SEMICONDUCTOR MATERIAL WAFER BY THROUGH VIAS, which is hereby incorporated by reference to the maximum extent allowable by law.

BACKGROUND

1. Technical Field

Embodiments relate to the determination of local mechanical stress induced in a semiconductor material wafer supporting interconnection levels on one surface when vias crossing the wafer are formed.

2. Discussion of the Related Art

During certain semiconductor wafer processings, mechanical stress may appear in the wafer and in different elements formed inside and on top of it. Further, such stress may appear due to temperature variations to which the wafer is subsequently submitted, and/or during the use of chips obtained from this wafer.

FIG. 1 is a cross-section view of a semiconductor wafer 1 having its rear surface supporting interconnection levels 2, comprising an insulating material 3 and metallizations, a single metallization, 4, being shown. This semiconductor wafer has been thinned and an opening has been formed from the front surface all the way to metallization 4. A conductive material 5, for example, a metal layer, for example, copper, has been deposited on the walls and the bottom of the opening. The opening can then be filled or not with a material 6, for example, an insulating polymer. Conductive material 5 and insulating filling material 6 form a via crossing the semiconductor wafer, which enables to access metallization 4.

As an example, the diameter of the vias may range between one and one thousand micrometers, and their depth may vary from some ten to several hundreds of micrometers.

In structures such as that shown in FIG. 1, significant levels of mechanical stress may appear, mainly at the bottom of the vias. Such significant mechanical stress levels are capable of deteriorating material 5 of the vias and of adversely affecting, after several uses, the proper electric operation of devices formed from the semiconductor wafer. Issues of electric and mechanical reliability of the devices may arise. It is desirable to be able to measure the mechanical stress induced in a semiconductor wafer after a specific processing to determine manufacturing methods, natures of materials, and layer thicknesses capable of decreasing this stress.

Existing methods for measuring the mechanical stress present in semiconductor wafers after they have, for example, been submitted to the forming of vias require sawing the semiconductor wafer to access the regions where the stress is desired to be measured. Such measurement methods, for example, are micro-Raman spectroscopy to determine the stress in silicon, X-ray diffraction to determine the stress in metal, or the so-called Digital Image Speckle Correlation (DISC) technique.

Such conventional measurement methods suffer from a main disadvantage, which is the need to saw the semiconductor wafer before the measurement. Now, the stress to be measured is partly released or modified on sawing of the semiconductor wafer. The stress which was present in the structure before the sawing of the wafer is thus no longer measured after the sawing.

Methods enabling to accurately determine the stress induced in a semiconductor material wafer having a surface supporting interconnection levels in the forming of vias crossing the wafer are thus needed.

SUMMARY

Thus, an embodiment overcomes at least some of the disadvantages of conventional methods for determining the mechanical stress induced in elements of a semiconductor material wafer supporting interconnection levels on a surface on forming of vias crossing the wafer.

An embodiment provides a method which does not require sawing the semiconductor material wafer in which the mechanical stress is desired to be determined.

An embodiment provides a method for determining, in a first semiconductor material wafer having at least one through via, mechanical stress induced by said at least one through via, the method comprising the steps of: manufacturing a test structure from a second wafer of same nature as the first wafer, in which said at least one through via is formed by a substantially identical method, a rear surface layer being further arranged on this second wafer so that the via emerges on said layer; measuring the mechanical stress in said rear surface layer; and deducing therefrom the mechanical stress induced in the first semiconductor material wafer.

According to an embodiment, the semiconductor material of the first and second wafers is silicon.

According to an embodiment, the rear surface layer of the test structure is an insulator and single-crystal silicon bilayer, the via emerging on the insulator.

According to an embodiment, the measurement of the mechanical stress from the rear surface layer is obtained by optical and/or electric and/or mechanical measurements.

According to an embodiment, an interconnection layer is further arranged on the rear surface of the first wafer so that the via emerges on said layer.

According to an embodiment, the through via is formed in the first and the second wafer by the steps of: forming an opening in the so-called front surface of each of the wafers opposite to the rear surface; depositing a layer of a conductive material on the walls and the bottom of the openings; and filling the openings with a filling material.

According to an embodiment, the filling material is an insulating material.

According to an embodiment, the deduction of the mechanical stress induced in the first wafer is obtained by matching, by successive iterations, results of finite element simulations of the model of a structure equivalent to the test structure with the measurements obtained on the test structure, and by applying the model resulting from these iterations to the model of the structure of the first wafer.

According to an embodiment, the application of the model resulting from these iterations to the model of the structure of the first wafer enables to obtain a mapping of the stress in said wafer.

Another embodiment provides a test structure used to implement the above method.

The foregoing and other objects, features, and advantages will be discussed in detail in the following non-limiting description of specific embodiments in connection with the accompanying drawings.

BRIEF DESCRIPTION OF THE DRAWINGS

As usual in the representation of integrated circuits, FIGS. 1 and 2 are not to scale.

DETAILED DESCRIPTION

Figure 1:
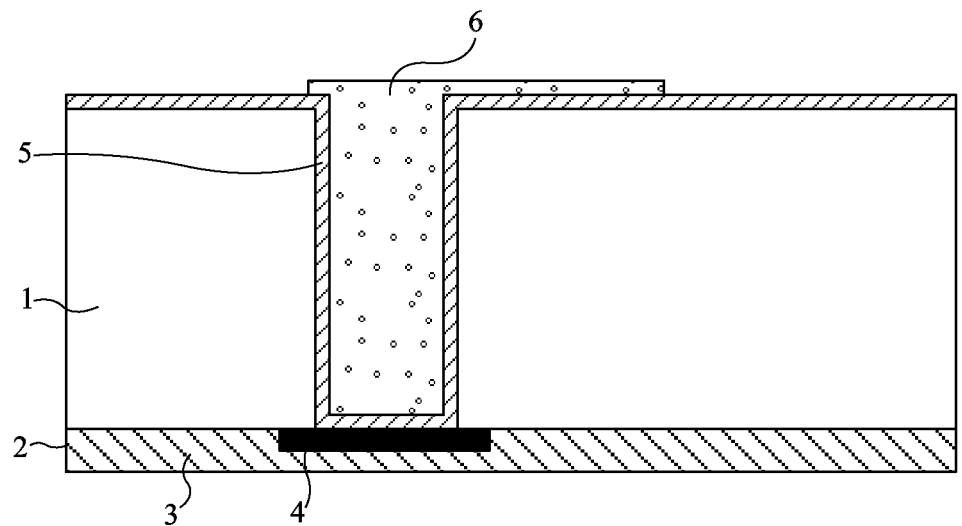
FIG. 1, previously described, is a cross-section view of a semiconductor wafer supporting interconnection levels on its rear surface and in which a through via has been formed.
Figure 2:
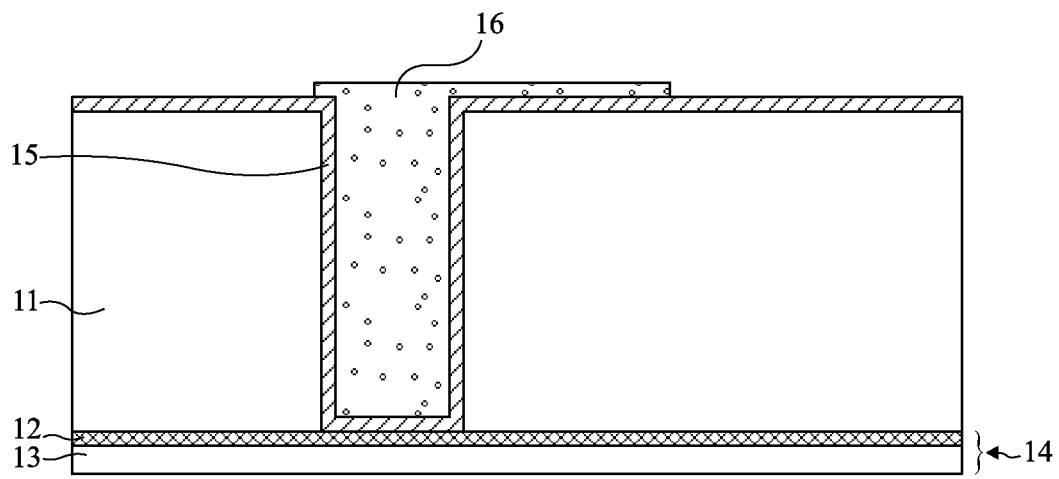
FIG. 2 is a cross-section view of a test structure for determining the mechanical stress in a semiconductor material wafer.
Figure 3:
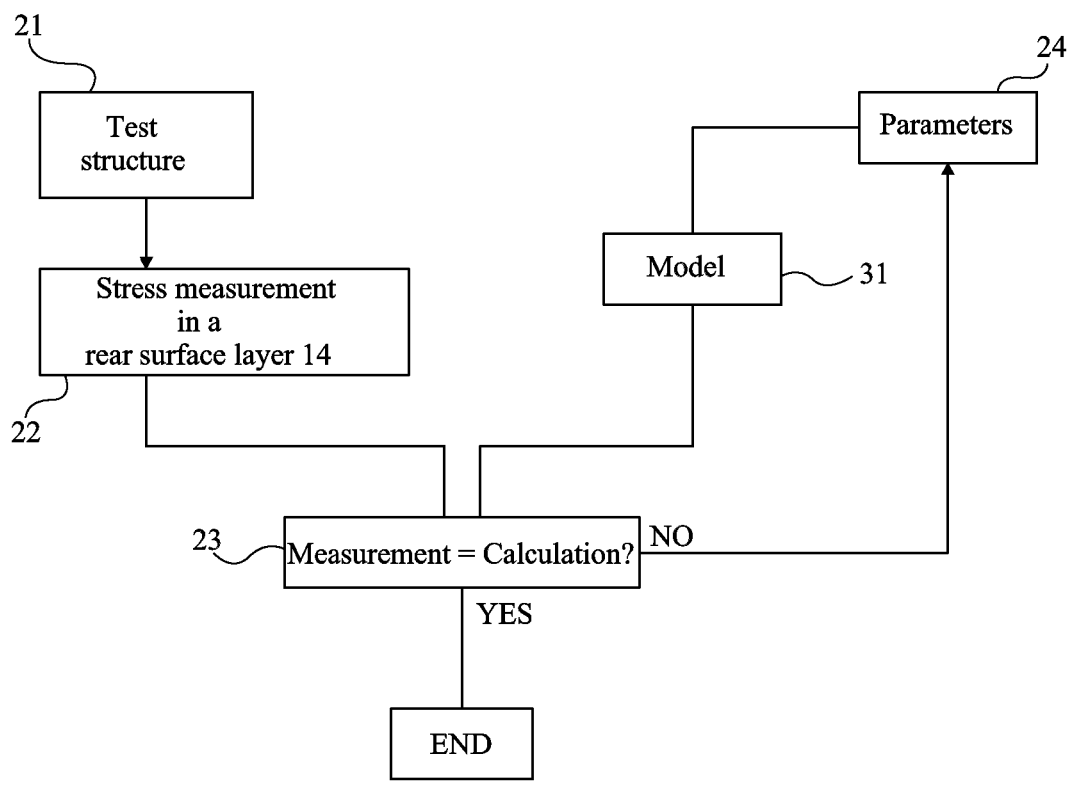
FIG. 3 shows in the form of a flowchart a method for determining mechanical stress induced in a semiconductor wafer supporting interconnection levels on a surface and in which through vias have been formed.

A method enabling to accurately determine the mechanical stress in the various elements of a semiconductor material wafer of the type shown in FIG. 1 comprises using a test structure such as illustrated in FIG. 2 by applying the steps illustrated in the flowchart of FIG. 3.

In a first step, 21, a test structure such as shown in cross-section view in FIG. 2 is manufactured. This test structure comprises a wafer 11 of a semiconductor material, for example, silicon, which has been submitted to the same processings as wafer 1 of FIG. 1, but having its rear surface supporting, instead of interconnection levels 2, a rear surface layer 14, for example, a bilayer successively comprising a silicon oxide layer 12 and a thin single-crystal silicon layer 13. This corresponds to a silicon-on-insulator structure.

Like the semiconductor material wafer of FIG. 1, the test structure has been thinned, an opening has been formed inside of it, and a conductive material 15, for example, copper, has been deposited on the walls and the bottom of the opening, the latter having then been filled with a filling material 16, for example, an insulator. Conductive material 15 and filling material 16 form a via crossing semiconductor material wafer 11, identical to that crossing semiconductor wafer 1.

In a next step, 22, the mechanical stress and/or deformations induced by the via in the thin rear surface layer of the test structure is experimentally measured. Such measurements may be performed by conventional techniques for measuring mechanical stress and/or deformations. Further, the mechanical stress in thin rear surface layer 14 may also be indirectly determined, either by measurements of the mobility of the electrons or holes in N- or P-channel MOS transistors, which would have been manufactured in rear surface layer 14, or by a variation of a physico-chemical (electric, mechanical, optical, or other) property of a MEMs device constructed above the via (on top and/or inside of layer 14), like for example a piezoresistive gauge.

In the case of an optical measurement of the stress, such as the diffraction of X rays or the micro-Raman, rear surface layer 14 is formed of an assembly of layers in which this measurement is possible (semiconductor material, metallic material, etc.).

In the case of an electric measurement of the stress (measurement of the resistivity of semiconductor or metallic materials, measurements of the mobility of charge carriers in semiconductor materials), rear surface layer 14 contains the devices necessary for this measurement. The electric measurement will be either a measurement of the variation of the resistance of a gauge formed in a layer of a piezoresistive material, which may itself belong to a more complex network such as a Wheatstone bridge, or a measurement of the variation of the mobility of charge carriers within a CMOS-type device dedicated to this use.

In the case of a mechanical measurement of the stress in rear surface layer 14, said layer should either contain the stress gauges formed according to techniques borrowed from MEMs or NEMs, necessary to this measurement, or enable a measurement of the deformation of the membrane above the via, by a contact method such as that used by a mechanical profile meter, or a contactless method such as that used by a confocal microscope, or an optical beam deviation measurement device, after focusing on the membrane, or a direct optical measurement on an image of this deformation obtained by optical or electronic or acoustic microscopy.

Simultaneously, in a step 31, the mechanical behavior of the test structure is modeled to anticipate the stress present within the structure. The selected theory enables forming equations for the real phenomena involved in the considered structure. This modeling requires making a number of assumptions as to the initial stress present at various locations in wafer 11 and in regions 15 and 16. It also requires defining a number of parameters, corresponding to the shape and to the nature of the different elements forming the structure. Since the materials of elements 11, 12, and 13 are well known, the parameters associated therewith are easily introduced into the model. The other parameters, for example associated with the materials of elements 15 and 16, are generally much less known, but their variation range is known. A specific initial value is thus selected for each unknown parameter in its variation range. The resolution of the equations controlling the behavior of the structure is for example performed by means of the use of a finite element digital simulation software. The results indicate the stress in the entire structure, and the stress in rear surface layer 14 is thus more specifically obtained.

Once steps 22 and 31 have been carried out, in a step 23, the results of the experimental measurement of the stress in thin rear surface layer 14 obtained at the end of step 22 are compared with those of the stress calculation in thin rear surface layer 14 obtained at the end of step 31.

The first results obtained from the modeling may not correspond to the measurement results. The values of the different parameters, that is, the initial stress and the unknown parameters linked to the nature of the materials, are thus modified at a step 24, after which the model equations are solved again. This step is followed by a new comparison between the to results of the measurement and of the model. The value of the parameters is thus adjusted until the results of the model match those of the experimental measurement of the stress in thin rear surface layer 14 (END). The results of the model then indicate the stress in the various elements of semiconductor wafer 11 and thus in those of wafer 1.

Several test structures corresponding to the same semiconductor wafer 1 in which the stress is desired to be determined may be manufactured with different rear surface layer thicknesses to increase the accuracy of the method for determining the mechanical stress. After measuring the stress in the thin rear surface layer of each test structure, several modeling cycles may be carried out, thus enabling to better adjust the parameters.

As an example, the thickness of silicon oxide layer 12 and that of thin single-crystal silicon layer 13 may be both comprised between 0.1 and 10 µm.

An advantage of such a method for determining the mechanical stress in a structure such as shown in FIG. 1 is that the use of a test structure such as illustrated in FIG. 2 enables to directly measure, by various conventional methods, the stress in rear surface layer 14. Due to the presence of this layer, the stress in the different elements of the structure which are not directly accessible to stress measurements if the semiconductor material wafer is not sawn can be indirectly determined.

Another advantage of such a method is that the use of a test structure comprising a rear surface layer 14 made of at least one top single-crystal silicon layer 13 enables to measure the stress in the single-crystal silicon layer 13 to a precision as low as several atoms. It is thus possible to obtain a mapping of the stress distribution in the different elements of the structure, and more particularly at the bottom of a via and close to a via.

Another advantage of such a method is that it is further possible to integrate such a control device during the manufacturing of chips and to obtain an in-situ or even real-time measurement of the stress induced in the devices.

In the present description:
"through via" is used to designate any opening, emerging or not, crossing all or part of a wafer;
"semiconductor material" is used to designate a wafer comprising at least one semiconductor layer, the through via being formed at least partly in this layer;
the fact for the test structure to comprise the same via(s) as the first wafer and to be formed in the same way and in the same material as the first wafer enables to obtain a test wafer comprising the same stress induced by the presence of the via(s);
the models of the structures of the two wafers are for example developed on one or several finite element simulation software tools. Simulations require knowing the geometry of the structures to be modeled. In the iterations aiming at having the stress measurements correspond to the results of the simulations, the physical and/or chemical (thermal, mechanical, etc.) properties of the materials of the modeled structure are varied. The fields of variation of these properties are set according to what is known of the concerned materials.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for determining, in a first semiconductor material wafer having at least one through via, mechanical stress induced by said at least one through via, the method comprising the steps of:
    manufacturing a test structure from a second wafer of a same nature as the first wafer, in which said at least one through via is formed by a substantially identical method, a rear surface layer being further arranged on this second wafer so that the via emerges on said layer;
    measuring the mechanical stress induced by said at least one through via in said rear surface layer; and
    deducing therefrom the mechanical stress induced in the first semiconductor material wafer.

2. The method of claim 1, wherein the semiconductor material of the first and second wafers is silicon.

3. The method of claim 1, wherein the rear surface layer of the test structure is an insulator and single-crystal silicon bilayer, the via emerging on the insulator.

4. The method of claim 1, wherein the measurement of the mechanical stress from the rear surface layer is obtained by optical and/or electric and/or mechanical measurements.

5. The method of claim 1, wherein an interconnection layer is further arranged on the rear surface of the first wafer so that the via emerges on said layer.

6. The method of claim 1, wherein the through via is formed in the first and the second wafer by the steps of:
    forming an opening in the so-called front surface of each of the wafers opposite to the rear surface;
    depositing a layer of a conductive material on the walls and the bottom of the openings; and
    filling the openings with a filling material.

7. The method of claim 6, wherein the filling material is an insulating material.

8. The method of claim 1, wherein the deduction of the mechanical stress induced in the first wafer is obtained:
    by matching, by successive iterations, results of finite element simulations of the model of a structure equivalent to the test structure with the measurements obtained on the test structure, and
    by applying the model resulting from these iterations to the model of the structure of the first wafer.

9. The method of claim 8, wherein the application of the model resulting from these iterations to the model of the structure of the first wafer provides a mapping of the stress in said wafer.

10. A test structure used to implement the method of claim 1.

* * * * *

UNITED STATES PATENT AND TRADEMARK OFFICE
CERTIFICATE OF CORRECTION

| | |
|---|---|
| PATENT NO. | : 8,726,736 B2 |
| APPLICATION NO. | : 13/524699 |
| DATED | : May 20, 2014 |
| INVENTOR(S) | : Mohamed Bouchoucha et al. |

It is certified that error appears in the above-identified patent and that said Letters Patent is hereby corrected as shown below:

In the Specification

*At column 4, line 41, delete the word "to".*

Signed and Sealed this
Twenty-sixth Day of August, 2014

Michelle K. Lee
*Deputy Director of the United States Patent and Trademark Office*